United States Patent [19]

Clarke

[11] 4,219,397

[45] Aug. 26, 1980

[54] MAGNETRON SPUTTER APPARATUS

[76] Inventor: Peter J. Clarke, 760 Arcady Rd., Santa Barbara, Calif. 93108

[21] Appl. No.: 963,335

[22] Filed: Nov. 24, 1978

[51] Int. Cl.² ............................................. C23C 15/00
[52] U.S. Cl. ................................. 204/192 R; 204/298
[58] Field of Search ............................ 204/298, 192 R

[56] References Cited

U.S. PATENT DOCUMENTS

| 3,878,085 | 4/1975 | Corbani | 204/298 |
| 4,060,470 | 11/1977 | Clarke | 204/192 R |
| 4,100,055 | 7/1978 | Rainey | 204/298 |

OTHER PUBLICATIONS

Peter J. Clarke, Ths S-Gun: A Direct Replacement for the Electron Beam Evaporator; Solid State Technology, Dec. 1976, pp. 77-79.

Primary Examiner—John H. Mack
Assistant Examiner—William Leader
Attorney, Agent, or Firm—Harry E. Aine; Harvey G. Lowhurst

[57] ABSTRACT

In a magnetron sputter gun for sputtering cathode material at subatmospheric pressure from a target onto a workpiece, the sputter cathode target comprises a pair of rings disposed in the inner magnetic gap between a pair of axially spaced annular pole pieces of a magnetic circuit. The pair of cathode target rings include a main target ring, which is to receive a preponderance of the cathode erosion, and an auxiliary ring disposed within a counter bore at the inner lip of one of the pole pieces. The main and auxiliary target rings are disposed relative to the counter bored pole piece so as to shape the magnetic field in the region of the sputter target rings such that a nearly constant sputtering rate is attained from the target with constant applied anode to cathode potential and constant current during the time to produce erosion of a preponderance of the volume of the main target ring, whereby a controlled sputtering rate is obtained concurrently with a relatively high utilization of target material.

15 Claims, 10 Drawing Figures

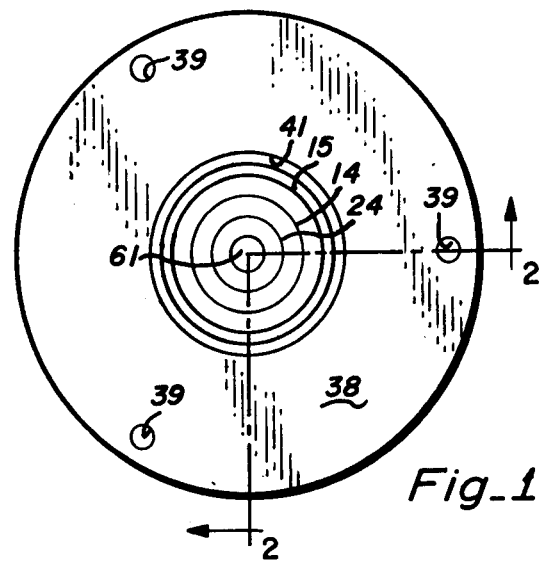
Fig_1
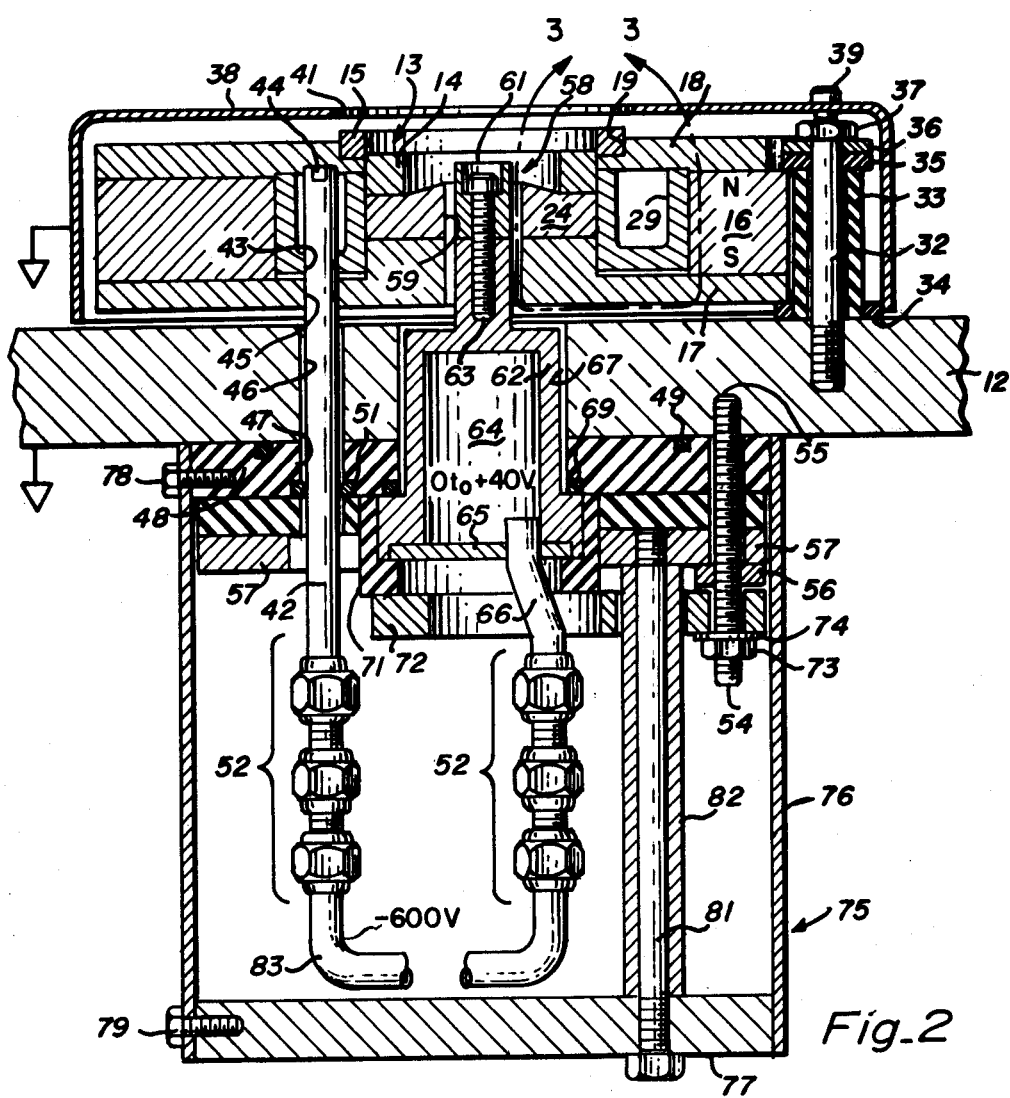
Fig_2

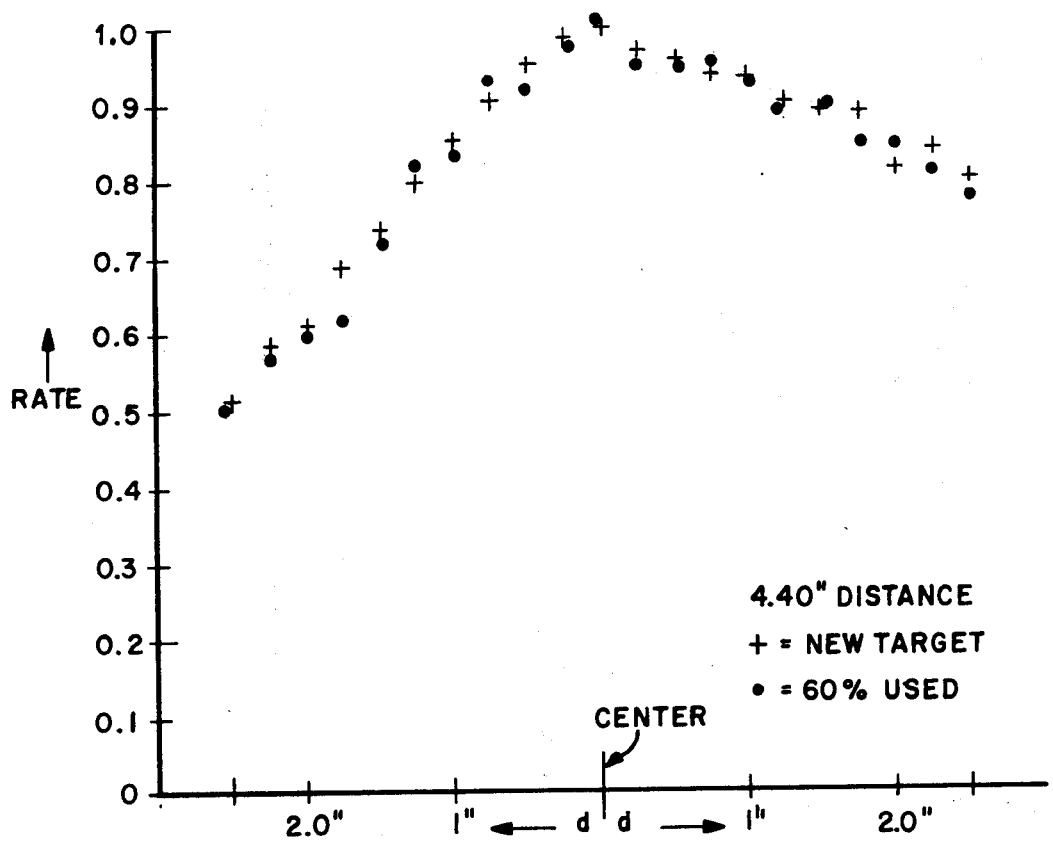
Fig_7
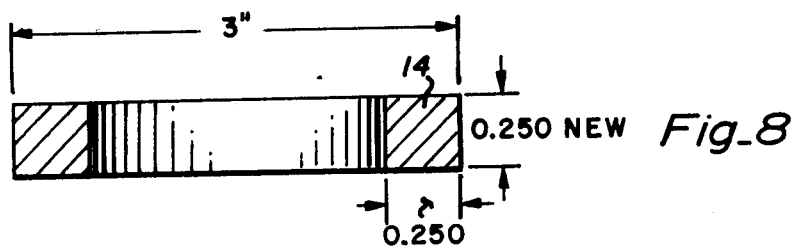
Fig_8
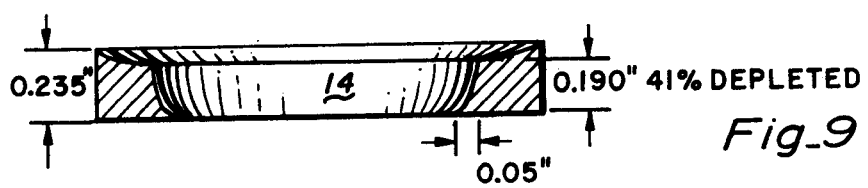
Fig_9
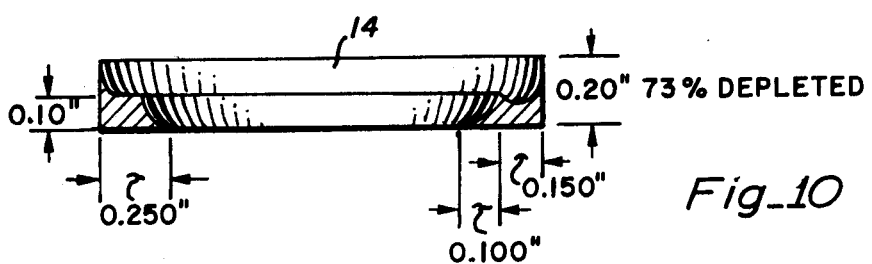
Fig_10

4,219,397

MAGNETRON SPUTTER APPARATUS

BACKGROUND OF THE INVENTION

The present invention relates in general to magnetron sputter guns for coating workpieces at subatmospheric pressure.

DESCRIPTION OF THE PRIOR ART

Heretofore, magnetron sputter guns have been proposed for establishing a glow discharge at subatmospheric pressure over a cathode sputter target consisting of a pair of annular rings of magnetic material. One of the target rings served as the main cathode member and the other ring of larger diameter served as the auxiliary cathode member. Such a magnetron sputter gun is disclosed in U.S. Pat. No. 4,060,470 issued Nov. 29, 1977.

In this prior device, the auxiliary cathode member was made of a ferromagnetic material and was relatively thin in the radial direction compared to the thickness of the main cathode member so as to be saturated by the magnetic field to permit the proper shaping of the magnetic field over the main sputter target ring. In the case of a nonmagnetic sputter cathode target, the target material was formed in the shape of a ring having an outwardly flared conical internal bore to receive the ion bombardment and thus the major erosion during sputtering. While such a flared sputter cathode has several advantages, it has the disadvantage that the sputter cathode ring is of relatively complicated geometry due to the conical surface. In addition, the sputtering rate from the prior sputter cathode targets decreased with erosion of the target and it would be desirable if the sputtering rate, with constant voltage and current, could remain constant during the time it takes to erode a preponderance of the volume of the cathode material, thereby simplifying the process of coating workpieces.

SUMMARY OF THE PRESENT INVENTION

The principal object of the present invention is the provision of an improved magnetron sputtering apparatus.

In one feature of the present invention, the sputter cathode target is shaped and arranged relative to the magnetic circuit so as to achieve a nearly constant sputtering rate from the target during the time it takes to erode a preponderance of the volume of the cathode target, whereby the process of sputter coating workpiece is simplified in use.

In another feature of the present invention, the sputter cathode target includes a pair of right circular cyinders, one of the cylinders having a substantially larger mean radius or diameter than that of the other, whereby the geometry of the cathode structure is simplified.

In another feature of the present invention, the sputter cathode target comprises a main and an auxiliary ring of target material with the auxiliary ring being positioned in a counterbored inner lip portion of one of the annular poles of the magnetic circuit, whereby shaping of the magnetic field is enhanced in the region of the main target cathode ring so as to achieve a more nearly constant sputtering rate as the main target cathode ring is eroded in use.

Other features and advantages of the present invention will become apparent upon a perusal of the following specification taken in connection with the accompanying drawings wherein:

BRIEF DESCRIPTION OF THE DRAWINGS

FIG. 1 is a plan view of a sputter cathode gun incorporating features of the present invention, FIG. 2 is an enlarged sectional view of the structure of FIG. 1 taken along line 2—2 in the direction of the arrows, FIG. 7 is a plot of normalized sputter rate vs distance from the centerline of the annular cathode sputter ring for a new cathode ring and for a 60% depleted ring, FIG. 8 is a longitudinal sectional view of a new sputter target ring, FIG. 9 is a view similar to that of FIG. 8 depicting the sputter erosion pattern at 41% depletion, and FIG. 10 is a view similar to that of FIG. 9 depicting 73% depletion.

DESCRIPTION OF THE PREFERRED EMBODIMENTS

Figure 3:
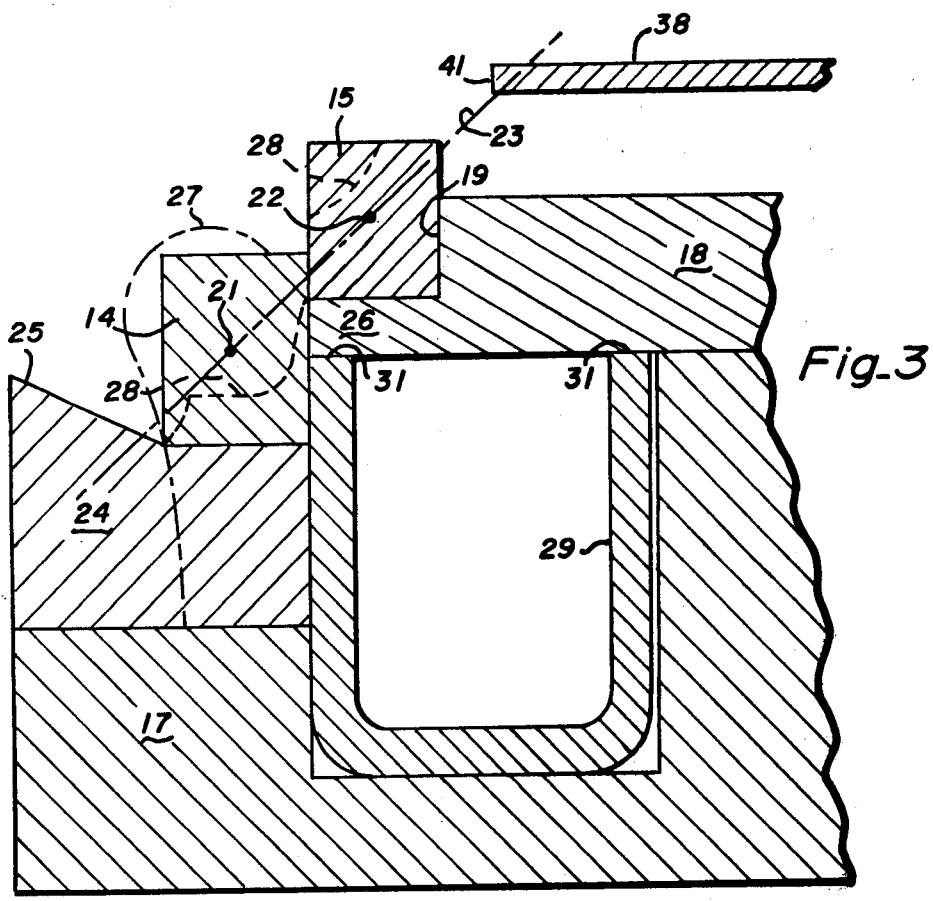
FIG. 3 is an enlarged sectional view of a portion of the structure of FIG. 2 delineated by line 3—3.

Referring now to FIGS. 1, 2 and 3 there is shown the magnetron sputter gun 11 of the present invention. The gun 11 is mounted to a base plate 12, as of aluminum or stainless steel, of a vacuum chamber which is to contain the workpiece to be coated.

The magnetron sputter gun 11 includes a sputter cathode electrode structure 13 containing the material which is to be sputtered from the gun 11 onto the workpiece. In a typical example, the sputter cathode target 13 is made of aluminum, gold, platinum-silicide, or other elements or alloys. The target cathode 13 comprises a pair of right circular cylindrical members 14 and 15, cylinder 14 being the main sputter cathode target and cylinder 15 being the auxiliary sputter cathode target. The composite target 13 is disposed in the inner annular magnetic gap of a magnetic circuit formed by permanent magnetic ring 16, as of ceramic Indox 5 magnetic material, axially polarized. A pair of annular magnetic pole pieces 17 and 18 are disposed at opposite axially spaced ends of the magnetic ring 16. Upper magnetic pole piece 18 has a larger inside diameter and that of the lower pole piece 17 to define an outwardly flared annular central magnetic gap therebetween in which the cathode target electrode structure 13 is disposed.

The inner lip of the upper pole piece ring 18 is counterbored at 19 to form an internal shoulder to snuggly receive one end and outer periphery of the auxiliary cathode ring 15.

The main cathode ring 14 abuts at its outer periphery the inner lip of the upper pole piece 18. The two cathode rings 14 and 15 are axially displaced with respect to each other and partially axially coextensive so that the center of volume of each of the rings, at 21 and 22 respectively, lies along a surface 23 which is outwardly flared and conically shaped so that the cathode rings 14 and 15 approximate the aforecited prior art cathode ring having an outwardly flared conical sputter surface, but with a less complicated right circular cylindrical geometry.

An annular non-sputtering cathode ring 24 is disposed between the main sputter cathode ring 14 and the bottom magnetic pole piece 17. In a typical example, cathode electrode ring 24 is made of copper or aluminum to provide a relatively high thermal conductivity for cooling the abutting surface of the main cathode ring 14. The inner lip of the cathode ring 24 is upturned, at 25, for reducing and shaping the electric field in the region of the inner lip of the main sputter cathode ring 14 so as to reduce sputtering of cathode material at the base of the main cathode ring 14 and so as to provide a net build up of sputtered cathode material on the upturned lip 25 of the electrode 24.

The inwardly projecting end 26 of the upper pole piece 18 serves to bow the magnetic field lines outwardly and upwardly relative to the conical surface 23 in such a manner as to produce a localized crossed electric and magnetic field vector region over the main cathode ring 14, as indicated by magnetic field line 27, thereby confining a preponderance of the cathode erosion to the main cathode ring 14. In this manner, during the sputtering process, the main cathode ring 14 erodes to a final position, as indicated by the dotted line 28, at which time approximately 65%, by volume, of the main cathode ring 14 has been depleted while achieving constant sputtering rate and distribution with constant current and voltage supplied to the magnetron glow discharge with only a small change in operating pressure being made as necessary to hold these parameters constant.

Figure 4:
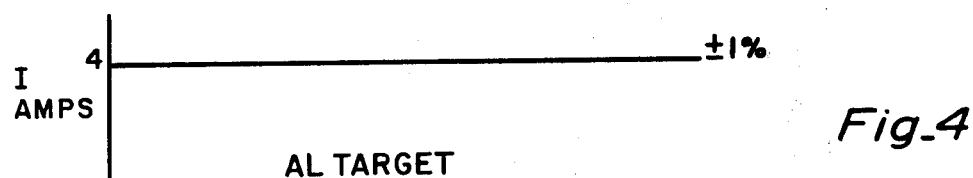
FIG. 4 is a plot of glow discharge current in amperes vs time for the magnetron sputter gun of FIGS. 1, 2 and 3.
Figure 5:
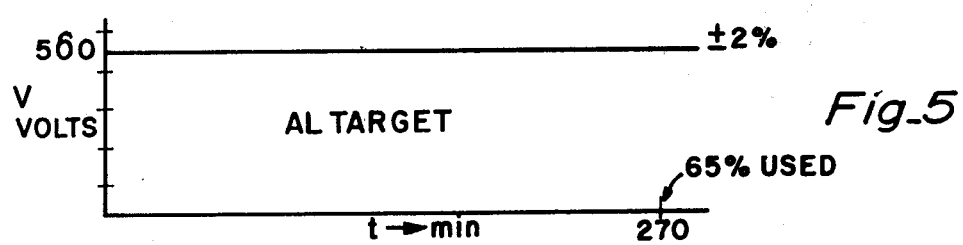
FIG. 5 is a plot of anode-to-cathode potential vs time for the magnetron sputter gun of the present invention.
Figure 6:
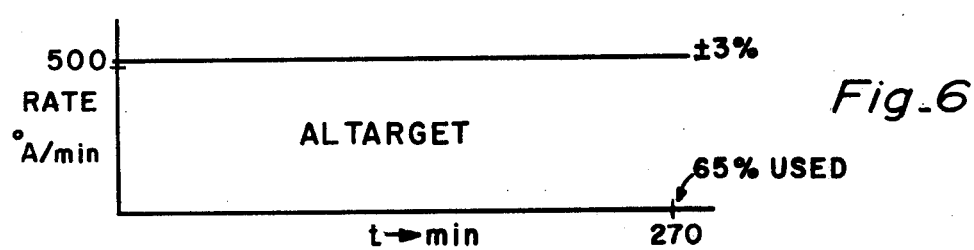
FIG. 6 is a plot of sputter coating rate vs time for the magnetron sputter gun of the present invention.

These constant current, voltage and sputtering rate characteristics are depicted in FIGS. 4–6. The depletion line 28 represents approximately a depletion of 65% of the cathode ring 14 during which time the constant sputtering rate is achieved. In a typical example, the power density incident on the main cathode ring 14 is approximately three kilowatts per square inch. Upon depletion of the main cathode ring 14 the evacuated chamber is opened and ring 14 is replaced. The erosion of the auxiliary cathode ring 15, is only about 30% of that experienced by the main cathode ring 14 so that it needs replacement only about every third time the main cathode ring 14 is replaced.

An annular coolant conduit 29, as of copper, is brazed at its upper open ends to the bottom surface of the upper pole piece 18 for bringing coolant into intimate contact with the upper pole piece 18 and with the cathode electrodes 14 and 15 and 24. Cooling of the cathode rings 14 and 15 is enhanced due to the thermal expansion of the rings 14 and 15 into intimate good thermally conducting relation with the cooled pole piece 18 and with the water channel 29.

The magnetic circuit, including the magnet 16 and pole pieces 17 and 18, is clamped to the base plate 12 via three stainless steel studs 32 therethrough. A Teflon sleeve 33 coaxially surrounds each stud for electrically insulating stud 32 from the magnet and cathode electrodes which operate typically at a potential of −600 volts relative to the base plate 12 which is grounded. A Teflon washer 34 surrounds the sleeve 33 and serves as a spacer for spacing and electrically insulating the lower pole piece 17 from the base plate 12. A Teflon washer 35 is disposed at the other end of the sleeve 33 for clamping the magnet 16 and its associated pole structures against the lower washer 34. A steel washer 36 overlies the Teflon washer 35 and a nut 37 clamps the assembly together.

An inverted cup shaped shield member 38, as of aluminum or stainless steel, is electrically connected to the stud and thus to the ground plate 12 via a cap screw 39 threadably mating with tapped bores in the upper ends of the studs 32. The shield 38 is centrally apertured at 41 serving as an anode electrode for shaping the electric field in the region of the pole piece 18 so that the magnetic and electric fields in the region between the shield 38 and the pole piece 18 are parallel. In this manner, setting up of a magnetically confined glow discharge under the shield is avoided so as to avoid undesired sputtering from the pole piece 18 operating at cathode potential.

Coolant is circulated through the coolant channel 29 via a pair of axially directed input and exhaust tubes 42, only one of which is shown in FIG. 2. The tubes 42 are brazed to and pass through apertures 43 at the bottom of the channel member 29 and are disposed in diametrically opposed relation in the channel 29 so that coolant flowing through one of the tubes 42 passes into the channel 29 via an axially directed slot 44 in the inner end of the tube 42 and thence travels circumferentially around the channel 29 to the diametrically opposed tube and thence into that tube through the slotted end 44 and out through the exhaust tubulation 42.

The tubes 42 pass through aligned bores 45 in the lower pole piece 17, through axial bores 46 in the base plate 12, and thence through aligned bores 47 in an electrically insulative mounting ring 48, as of Teflon. The Teflon mounting ring 48 is sealed in a gas tight manner to the bottom of the base plate 12 via an O-ring 49 and the coolant tubes are sealed to the mounting ring 48 via O-rings 51. The coolant tubes 42 are brazed to the apertures 43 in the channel 29 and therefore the cathode structure including the magnetic circuit is removeable from inside the chamber by unbolting studs 32 and unfastening a pair of quick disconnect swage lock fittings 52 on the outside of the vacuum envelope and then pulling the tubes 42 through the bores 46 and 47 in the baseplate 12 and mounting ring 48, respectively. The mounting ring 48 is held to the underside of the base plate 12 via the intermediary of three studs 54 threadably mating with tapped bores 55 in the underside of the base plate 12 and via a steel clamping ring 57 which is clamped via nuts 56.

A central anode electrode 58 projects centrally through a bore 59 in the lower pole piece 17 and electrode 24. Central anode 58 includes an inner tip portion 61, as of aluminum, held to a base member 62, as of copper, via a cap screw 63. The base member 62 is made of a thermally conductive material and includes a cylindrical water coolant chamber 64 closed by an end cap 65 through which a pair of coolant tubes 66 pass for bringing coolant into and out of the coolant chamber 64. Base member 62 is concentrically disposed within a central bore 67, in the mounting ring 48 and in the base plate 12. Anode member 62 includes a lower outwardly flanged portion 68 sealed in a gas tight manner to the mounting ring 48 via O-ring 69. The center anode 62 is clamped to the mounting plate 48 and thus to the base plate via inwardly flanged cylindrical insulator 71, as of Teflon, which is in-turn clamped via a clamping ring 72 as of steel, via nuts 73 and washers 74 carried from the three mounting studs 54.

A protective housing 75 which consists of a sheet stainless steel cylinder 76 and steel end plate 77 surrounds the tubulations and swage lock fittings 52 for housing same. Sheet metal cylinder 76 is affixed to the mounting ring at the base via radial cap screws 78 and is secured to the end plate 77 via radial cap screws 79. The end plate 77 is fixedly secured to the steel mounting ring 57 via a plurality of studs 81 threadably mating with tapped bores in the mounting ring 57 and including concentrically mounted spacer sleeves 82, as of steel, for spacing the end plate 77 from the mounting ring 57. Apertures are provided in the end plate 77 for passage therethrough of the input and output coolant tubes and for passage therethrough of electrical conductive leads, one for providing a bias potential of 0 to +40 volts to the central anode electrode 58. The other lead is connected to the coolant tubes 42 for providing the cathode potential to the cathode structure in use. The exhaust tubulation 66 for the anode electrode 58 is coupled by means of an electrically insulative flexible tube 83 to the cathode coolant tubulation 42 via the swage lock fittings 52 so that coolant flow for the central chamber 64 and the cathode coolant channel 29 are serially connected to the input and output coolant tubes.

The advantages of the magnetron sputter gun 11 of the present invention include: simplified and therefore less costly sputter cathode target geometries, i.e., right circular cylindrical geometries, coupled with the arrangement of the magnetic and electrical circuits so that a constant sputtering rate is achieved over the operating life of the main sputter cathode target, i.e., to the 65% depletion point, whereby processing of workpieces is simplified in use. The nearly constant sputtering rate, and nearly constant distribution of sputtered material, is achieved with only minor adjustments in the pressure of the working gas, such as argon, from, for example, $2.4 \times 10^{-3}$ torr to $2.0 \times 10^{-3}$ torr over the operating lifetime of the main cathode target ring 14. Heretofore, the rate of sputtering could not be maintained constant and sputtering distribution could not be maintained constant no matter how much pressure was changed. As used herein, "nearly constant" is defined to mean within ±10%.

The nearly constant sputtering rate and nearly constant distribution of sputtered material (See FIG. 7) over the useful operating lifetime of the main cathode ring 14 is an unexpected result and the precise reasons for this result is not understood. However, it is believed to be due to the shaping of the magnetic and electric fields in the glow discharge region over the sputtering surface of the cathode rings 14 and 15. This shaping is believed to be primarily attributable to the location of the main cathode ring 14 relative to the inner extension 26 of the upper pole piece 18 and further due to the shaping of the electric field lines due to the inner upturned lip portion 25 of the cathode electrode 24.

It is noteworthy that the erosion of the main cathode ring 14 takes place on two faces, i.e., the upper face and the inner side face, see FIGS. 8-10. In operation, two glow discharge regions are observed, one over the top surface of ring 14 and the other over the inner side surface. These two glow discharge regions are thought to complement each other to result in a more nearly constant sputtering rate while achieving a generally constant sputtering distribution over the useful operating lifetime of the main cathode ring 14, i.e., during the time to deplete more than 50% by volume of the main cathode ring 14.

What is claimed is:

1. In a magnetron sputter gun for establishing a glow discharge at subatmospheric pressure to produce sputtering of material from a cathode target onto a workpiece to be coated;

anode and cathode electrode means for operating at different electrical potentials to establish in use an electrical field intercepted by said cathode electrode means;

said cathode electrode means including a target portion means made of a material to be sputtered and for sputtering from said target portion means of said cathode electrode means onto the workpiece;

magnet means for providing a magnetic circuit for producing a magnetic field in the glow discharge region of space between said anode and said cathode electrode means, said magnetic field having a substantial component thereof orthogonally directed to the direction of the electric field component in the glow discharge region overlying said target portion means of said cathode electrode means; and said cathode sputter target portion means comprising a main target loop portion means for sputtering therefrom a preponderance of the target material to be sputtered and a separate auxiliary target loop portion means of target material, said separate loop portion means being axially displaced and partially axially coextensive with respect to each other, and said auxiliary target loop portion means having a mean radius of curvature greater than that of said main target loop portion means.

2. The apparatus of claim 1 wherein said magnetic circuit means includes a magnetic permeable pole piece means for shaping the magnetic field overlying said target portions of said cathode electrode means, said pole piece means being disposed surrounding said main and auxiliary target portion means, and said pole piece means being axially coextensive with portion means of both said main and auxiliary target loop portions.

3. The apparatus of claim 2 wherein said pole piece means includes a portion radially coextensive with at least a portion of said auxiliary target portion means.

4. The apparatus of claim 3 wherein said radially coextensive portion of said pole piece means is of reduced axial extent relative to other portions of said pole piece means disposed surrounding said radially coextensive region.

5. The apparatus of claim 2 wherein said auxiliary cathode target portion means is disposed within a counterbored inner lip portion of said magnetic pole piece.

6. The apparatus of claim 1 wherein said main and auxiliary cathode target portion means are closed loops of target material, said loops being axially and radially displaced relative to each other so that the centers of the annuli defined by said loops fall on an outwardly flared generally conical surface.

7. In a magnetron sputter gun for establishing a glow discharge at subatmospheric pressure to produce sputtering of material from a cathode target onto a workpiece to be coated:

anode and cathode electrode means for operation at different electrical potentials to establish in use an electrical field intercepted by said cathode means;

said cathode electrode means including a target portion means made of a material to be sputtered and for sputtering from said target portion means of said cathode electrode means onto the workpiece;

magnet means for providing a magnetic circuit for producing a magnetic field in the glow discharge region between said anode and cathode electrode means, said magnetic field having a substantial component thereof orthogonally directed to the electric field component in the glow discharge region overlying said target portion means of said cathode electrode means; and said cathode sputter target portion means comprising a main target portion means and an auxiliary target portion means wherein said main and auxiliary target portion means are closed loops of target material, said loops being axially displaced and partially axially coextensive with respect to each other, said auxiliary target portion means having a mean radius of curvature greater than that of said main target portion means, and said target portion means being formed and arranged relative to said magnetic circuit for providing a nearly constant sputtering rate therefrom with constant applied anode to cathode potential and constant current drawn by the glow discharge during the time to produce erosion of a preponderance of the volume of said main target portion means of said cathode sputter target portion means.

8. The apparatus of claim 1 wherein said magnetic means includes a magnetically permeable pole piece means for shaping the magnetic field overlying said target portion of said cathode electrode means, said pole piece means being disposed surrounding said main and auxiliary target portion means, and said pole piece means being axially coextensive with portions of both said main and auxiliary target loops.

9. The apparatus of claim 8 wherein said pole piece means includes a portion radially coextensive with at least a portion of said auxiliary target portion.

10. The apparatus of claim 9 wherein said radially coextensive portion of said pole piece means is reduced in axial extent relative to other portions of said pole piece means disposed surrounding said radially coextensive portion.

11. The apparatus of claim 8 wherein said auxiliary cathode target portion means is disposed within a counterbored inner lip portion of said magnetic pole piece.

12. The apparatus of claim 7 wherein said main and auxiliary cathode target portions means are closed loops of target material, said loops being axially and radially displaced relative to each other so that the centers of the annuli defined by said loops fall on an outwardly flared conical surface.

13. In a method of operating a magnetron sputter gun for establishing a glow discharge at subatmospheric pressure to produce sputtering of material from a cathode target onto a workpiece to be coated:

providing anode and cathode electrodes for operation at different electrical potentials to establish an electrical field intercepted by said cathode;

said cathode electrode including a target portion made of a material to be sputtered from said target portion of said cathode electrode onto the workpiece;

energizing said anode and cathode electrodes to establish said electric field;

producing a magnetic field in the glow discharge region between said anode and cathode electrodes, said magnetic field having a substantial component thereof orthogonally directed to the electric field component in the glow discharge region overlying said target portion of said cathode electrode;

said cathode sputter target portion comprising a main target portion and an auxiliary target portion, said main target portion having two intersecting faces and being formed and arranged relative to the electric and magnetic fields in the glow discharge region for producing an erosion pattern of said main cathode target portion along said two intersecting faces; and sputtering material from said main target portion in such a manner that said two intersecting faces are maintained as receding intersecting faces during the time required to produce erosion of a preponderance of the volume of said main target portion of said cathode sputter target.

14. The method of claim 13 wherein said main cathode sputter target portion comprises a right circular cylinder having when new an end flat surface face and an inside cylindrical surface face and wherein during use said end surface face recedes leaving an outer marginal lip which is subject to less erosion, and wherein said inner face recedes leaving a bottom marginal lip which is subject to less erosion.

15. The method of claim 13 wherein said main cathode portion is a ring and including a non magnetic cathode electrode disposed adjacent and axially spaced from said main cathode ring, said cathode electrode having an upturned inner lip portion axially coextensive with a portion of said main cathode ring.

* * * * *